United States Patent [19]

Hanna et al.

[11] Patent Number: 4,689,651
[45] Date of Patent: Aug. 25, 1987

[54] LOW VOLTAGE CLAMP

[75] Inventors: John E. Hanna, Mesa; Ira Miller, Tempe, both of Ariz.

[73] Assignee: Motorola, Inc., Schaumburg, Ill.

[21] Appl. No.: 760,021

[22] Filed: Jul. 29, 1985

[51] Int. Cl.⁴ .................. H01L 29/72; H01L 29/90; H03K 5/08; H03K 3/26

[52] U.S. Cl. ........................... 357/36; 357/13; 357/34; 357/35; 357/86; 307/299 A; 307/559; 307/561; 307/565

[58] Field of Search .............. 357/36, 13, 34, 35, 357/86; 307/299 A, 559, 561, 565, 318

[56] References Cited

U.S. PATENT DOCUMENTS 3,488,564  4/1968  Crafts .................... 357/36
3,766,449  10/1973  Bruchez ................. 357/36
3,969,748  7/1976  Horie .................... 357/46

Primary Examiner—Martin H. Edlow
Assistant Examiner—D. Featherstone
Attorney, Agent, or Firm—Michael D. Bingham

[57] ABSTRACT

A low voltage clamp circuit comprises a transistor and semiconductor junction impedance circuitry for establishing an impedance such that the magnitude of a voltage applied across the emitter and collector of the transistor is clamped at a value that is less than the reverse breakdown voltage of the collector-to-emitter of the transistor if its base is shorted to the collector. The clamp circuit is suited to be manufactured in monolithic integrated circuit form and can be used to protect integrated bipolar transistors from having the reverse breakdown voltage of their emitter-base junctions exceeded.

2 Claims, 7 Drawing Figures

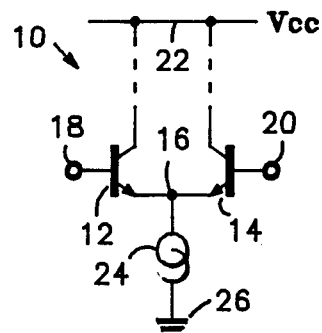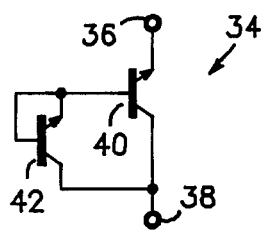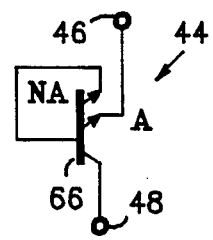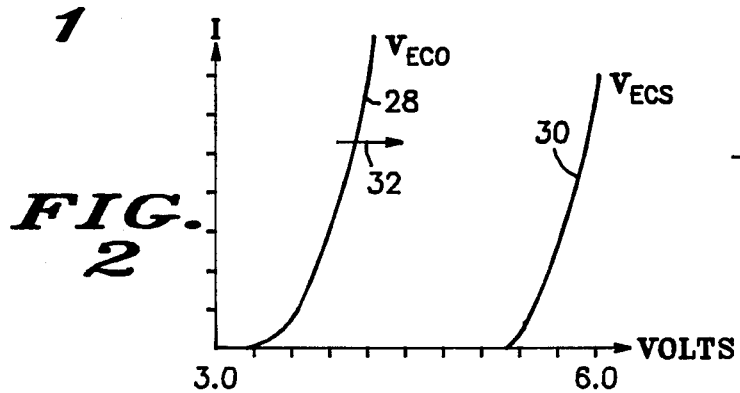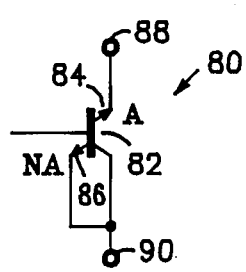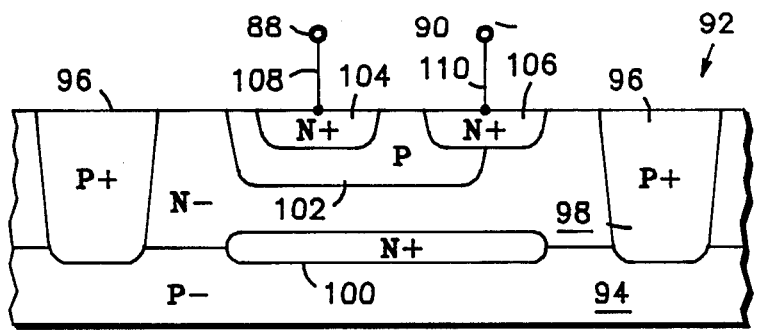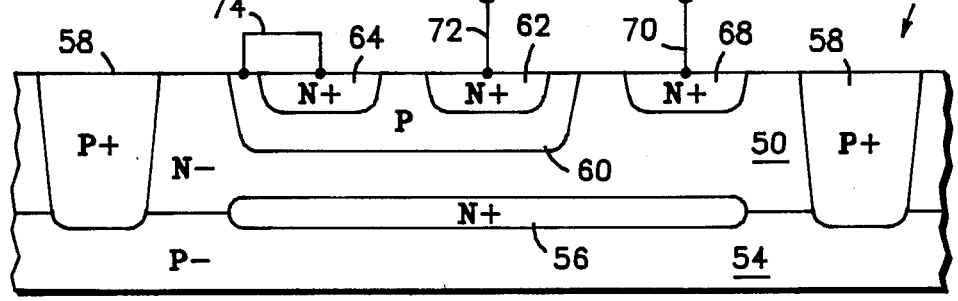

LOW VOLTAGE CLAMP

BACKGROUND OF THE INVENTION

The present invention relates to overvoltage protection and, more particularly, to a voltage clamp circuit suitable to be manufactured in monolithic integrated circuit form for clamping the voltage applied thereacross to a predetermined low value.

It is well known that emitter-base breakdown of typical monolithic integrated bipolar transistors can occur at a voltage range of approximately 5.3-7.2 volts. If the emitter-base junction of the transistor is repeatedly subjected to a reverse voltage applied thereacross which exceeds this breakdown voltage level the transistor can be destroyed or at least degraded. For instance, if the emitter-base junction is repeatedly caused to go into a avalanche condition by having its reverse breakdown voltage level exceeded, the transistor's forward current gain, beta, may be seriously affected which in turn affects the circuit operation in which the transistor is included.

In one contemplated circuit, a pair of bipolar integrated NPN transistors are differentially connected to thereby form a conventional differential amplifier. A problem in this circuit arises in that the two bases of the differentially connected transistors are coupled to respective inputs of the integrated circuit in which the two transistors are formed in order to allow user access to the inputs of the differential amplifier. In this application, it is possible for the input signal, supplied to differential amplifier inputs by the user, to exceed the reverse breakdown voltage characteristics of the non-conducting transistor of the differentially connected pair. For example, the supplied alternating input signal may exceed the value of $\pm(VEBS+VBE)$, where VEBS is the reverse emitter breakdown voltage of the nonconducting transistor and VBE is the forward emitter-to-base voltage of the conducting transistor. If this voltage level is exceeded, the transistors of the differential amplifier can be degraded as aforedescribed. It is therefore desirable to have an overvoltage protection circuit that would clamp the voltage applied to the input of the differential amplifier to a value which is less than $\pm(VEBS+VBE)$.

Additionally, it is desirable to allow the voltage level applied across the inputs of the differential amplifier to be as great as possible yet not exceed the above mentioned value in order that maximum gain can be achieved.

Another aspect of such a voltage clamp circuit is that the breakdown voltage thereof be adjustable in order to obtain an optimum tradeoff between protection of the transistors of the differential amplifier, for instance, and the usable input voltage range.

It is a further desirable aspect of such a voltage clamp circuit that the characteristics thereof track the emitter-base breakdown characteristics of integrated transistors so that variations in the breakdown characteristics of the transistors from process to process and lot to lot are compensated therefore.

Hence, a need exists for a low voltage clamp circuit suitable to be fabricated in monolithic integrated circuit form having the above described attributes.

SUMMARY OF THE INVENTION

Accordingly, it is an object of the present invention to provide an improved voltage clamp circuit.

Another object of the present invention is to provide an improved low voltage clamp circuit.

Yet another object of the present invention is to provide an improved voltage clamp circuit for clamping the voltage signal applied thereacross to a predetermined level.

Still another object of the present invention is to provide a voltage clamp circuit for symmetrically clamping an alternating voltage signal applied thereacross to a predetermined positive and negative level.

Still yet another object of the present invention is to provide a voltage clamp circuit for use in a monolithic integrated circuit for symmetrically clamping an alternating voltage signal applied thereacross to a predetermined absolute level.

A further object of the present invention is to provide an improved integrated voltage clamp circuit whose voltage can be adjusted by changing the geometry thereof.

A still further object of the present invention is to provide a two-terminal overvoltage protection circuit for symmetrically clamping an alternating voltage signal applied across the two terminals within a predetermined range in order to inhibit reverse voltage breakdown of the emitter-base junction of a pair of differentially connected bipolar integrated transistors which are connected to the terminals of the overvoltage protection circuit.

An additional object of the present invention is to provide a low voltage clamp circuit for inhibiting emitter-base voltage breakdown of a pair of differentially connected transistors of a monolithic integrated circuit wherein the low voltage clamp circuit characteristics track the emitter-breakdown characteristics of the monolithic integrated transistors to which it is coupled.

Another additional object of the present invention is to provide an improved voltage clamp circuit having a high breakdown voltage in one direction and a low breakdown voltage in the other.

In accordance with the above and other objects there is provided a low voltage clamp circuit suitable to be fabricated in monolithic integrated circuit form which clamps a voltage applied thereacross to a predetermined value comprising a transistor having emitter, base and collector regions, the voltage being applied between said emitter and collector regions; and semiconductor junction impedance circuitry for establishing an impedance between the base region and the collector region whereby the predetermined value at which the applied voltage is clamped occurs at a value less than the value of reverse voltage breakdown collector-to-emitter region of the transistor having its base region shorted to the collector region.

It is one aspect of the invention that a pair of voltage clamp circuits of the type above described are connected in parallel but back-to-back opposite direction to provide symmetrical clamping of an alternating voltage signal applied thereacross. The breakdown voltage in the reverse direction of the one voltage clamp circuit is larger than the clamp breakdown voltage of the other connected clamp current. A feature of this symmetrical low voltage clamp is therefore such that the clamp circuit can be integrally coupled across the inputs of a differential amplifier circuit formed within the monolithic integrated circuit to prevent the voltage signal applied across the inputs of the differential amplifier from exceeding the reverse voltage breakdown of the emitter-base junctions of the transistors comprising the differential amplifier.

BRIEF DESCRIPTION OF THE DRAWINGS

FIG. 1 is a schematic diagram of a conventional differential amplifier that is suited to be manufactured in monolithic integrated circuit form and to which the present invention is directed;

FIG. 2 is a graph illustrating particular voltage breakdown characteristics of typical bipolar integrated transistors;

FIG. 3 is a schematic diagram representing one embodiment of the preferred embodiment;

FIG. 4 is a schematic diagram of the preferred embodiment of the present invention;

FIG. 5 is a cross sectional view of a portion of an integrated circuit in which the embodiment of FIG. 4 is realized;

FIG. 6 is a schematic diagram of another embodiment of the present invention; and FIG. 7 is a cross sectional view of a portion of an integrated circuit in which the embodiment of FIG. 6 is realized.

DETAILED DESCRIPTION OF THE PREFERRED EMBODIMENT

Turning to first to FIG. 1 there is illustrated conventional differential amplifier 10 that is suited to be fabricated in monolithic integrated circuit form. Differential amplifier 10 includes a pair of bipolar NPN transistors 12 and 14 which have their emitters differentially coupled together at node 16. The base electrodes of the two transistors serve as differential inputs 18 and 20 of differential amplifier 10 as is well understood. The collectors of transistors 12 and 14 are coupled (indicated by the dashed lines) to a first power supply conductor 22 to which is applied a direct current (dc) operating potential $V_{CC}$. A current source 24 is coupled between node 16 and second power supply conductor 26 to which is a applied a reference potential such as ground potential.

As understood, current source 24 sources a substantially constant current therethrough that is supplied by transistors 12 and 14 as they are rendered conductive respectively by an alternating voltage signal applied across inputs 18 and 20. A differential output signal is produced at the collectors of the two transistors in response to the input voltage signal applied thereto. The inputs of differential amplifier 10 may be coupled to the outputs of a preceding differential amplifier stage or in some applications may be coupled to inputs of the integrated circuit in which the differential amplifier is formed in order to receive an user supplied alternating input voltage signal.

It is desirable to limit the voltage excursion of the applied voltage signal across inputs 18 and 20 to a predetermined value in order to protect transistors 12 and 14. If this voltage is not clamped, the emitter-to-base breakdown voltage of the two transistors 12 and 14 can be exceeded as the applied voltage goes positive and negative. For example, as the potential at input 18 goes positive, transistor 12 is rendered conductive while transistor 14 is rendered non-conducting. Thus, if the value of the applied voltage exceeds the value of $(V_{BE}+V_{EBS})$ (where $V_{BE}$ is the voltage across transistor the emitter-base of transistor 12, the conducting transistor, and $V_{EBS}$ is the reverse breakdown voltage of the emitter-base junction of transistor 14, the non-conducting transistor) transistor 14 could be destroyed or at least degraded in performance. Similarly, as the applied voltage across inputs 18 and 20 goes negative, transistor 12 can be degraded as the potential at input 18 exceeds $(V_{BE}+V_{EBS})$ in a negative going direction. The value of $(V_{BE}+V_{EBS})$ has been determined to be typically about 5.0 volts. Therefore, it is necessary to clamp the alternating input voltage applied across inputs 18 and 20 to ±5.0 volts or less. Simultaneous with the foregoing, it is desirable to allow the input signal applied to amplifier 10 to have a maximum voltage swing as possible for obvious reasons. If for example, an input signal of approximately ±4.0 volts is allowed, a very narrow voltage range is required at which the applied alternating voltage must be clamped. A suitable voltage clamp circuit must operate in conjunction with amplifier 10 to ensure that the voltage applied thereto does not exceed typically ±5.0 volts while permitting inputs voltages of ±4.0 volts to be supplied across inputs 18 and 20. This 1.0 volt window puts extreme requirements on any voltage clamp circuit due to variations in the emitter-to-base reverse voltage breakdown characteristics that arise with process variations associated with the manufacture of integrated circuits and variations in temperature. In view of the above, the present invention is concerned with providing a low voltage clamp circuit that symmetrically clamps a voltage applied thereacross to a predetermined maximum level. The novel voltage clamp circuit, as will be described, is suited to be fabricated in monolithic integrated circuit form and will track the emitter-base breakdown voltage of the transistors comprising the integrated circuit in which the clamp circuit may be coupled.

Referring to FIG. 2, the breakdown voltage characteristics of a particular bipolar transistor is graphically plotted. The graphs of FIG. 2 are useful for understanding the concepts inherent to the voltage clamp circuit of the present invention. Graph 28 illustrates the breakdown voltage between the emitter and collector of the bipolar transistor having its base electrode open-circuited. It is seen that the transistor begins to break down at a voltage of approximately 3.3 volts. However, the same transistor exhibits a break down voltage of approximately 5.3 volts when the base is shorted to the collector (graph 30). Hence, as the impedance between the base and collector of the transistor is reduced, the value of the reverse voltage at which the collector-emitter junction begins to break down is increased (indicated by arrow 32).

In view of the above, the present invention is now explained with reference to the remaining FIGS., in particular, FIG. 3 illustrates voltage clamp circuit 34 of the invention. In order to provide a clamp circuit that will clamp the voltage applied across the two terminals 36 and 38 to greater than 3.3 volts and less than 5.3 volts, it is necessary to approach the value of VECS (FIG. 2). Therefore, NPN transistor 40, which is operated in an inverted mode, is provided which has its emitter and collector regions coupled respectfully to terminals 36 and 38. A resistor could be placed between the base and collector of transistor 40 to approach $V_{ECS}$ however, the resultant breakdown voltage will have an undesirable temperature dependency. Instead, semiconductor junction impedance means such as diode connected transistor 42 is coupled between the base and collector of transistor 40 in order to provide an impedance of intermediate value therebetween. Referring back to FIG. 2 and the description thereof, the semiconductor impedance provided by diode connected transistor 42 results in voltage clamp 34 having a breakdown voltage that approaches the breakdown voltage of a conventional transistor having its base to collector shorted. By varying the relative geometries of devices 40 and 42 a breakdown voltage can be produced that varies in a range of 3.3 to 5.3 volts, for example. Hence, by connecting voltage clamp 34 between the inputs 18 and 20 of differential amplifier for example, by connecting terminals 36 and 38 therebetween respectively, the applied input voltage signal across the inputs of the differential amplifier will be clamped to a value of approximately 5.3 volts. It should be noted that, in the opposite direction, i.e., with opposite polarity voltage applied across terminals 36 and 38, the breakdown voltage of clamp circuit 34 is essentially that of $BV_{CEO}$, which is typically much higher than $BV_{ECS}$. Most of the current flows through voltage clamp 34 and not transistors 12 and 14 whenever the input voltage is clamped at a value of 5.3 volts. As transistor 14 is rendered nonconductive by a positive going voltage applied between inputs 18 and 20 its emitter-base is inhibited from being reversed biased thereby preventing the transistor from going into an avalanche condition. Similarly, by connecting an additional voltage clamp circuit 34, having its terminals 36 and 38 connected to respective inputs 20 and 18, the input voltage applied across terminals 18 and 20 is clamped to a value that does not exceed approximately −5.3 volts and transistor 12 is inhibited from having its emitter-base junction driven into avalanche.

Turning to FIGS. 4 and 5 there is shown voltage clamp circuit 44 of the preferred embodiment. Voltage clamp circuit 44 is the equivalent of clamp 34 and operates in the manner described above with reference to the latter to provide a semiconductor impedance between the base and collector of transistor 66. Voltage clamp circuit 44 comprises a two terminal device, terminals 46 and 48, which clamps the voltage signal applied thereacross to a predetermined value as described above. Voltage clamp circuit 44 is unique in that it can be formed within a single isolated epitaxial region 50 of a epitaxial layer that is formed as a portion of integrated circuit 52 (FIG. 5). Integrated circuit 52 is conventional in its structure and is fabricated using known process techniques comprises a P - substrate 54 upon which an epitaxial layer is formed. A buried layer 56 of N+ material is formed between isolated epitaxial region 50 and substrate 54. P+ isolation wells 58 are then formed within the epitaxial layer of the integrated circuit which make contact with underlying substrate 54 to thereby isolate epi-region 50 from the remaining epitaxial layer of the integrated circuit. A base region 60 of P-material can then be diffused into epitaxial region 50 and then emitter region 62 and 64 formed therein as is understood. Emitter region 62 corresponds to a first emitter of transistor 66. Likewise, emitter region 64 forms the second emitter of transistor 66 which has a common base region therebetween formed by base region 60. The collector region of transistor 66 is realized by isolated epitaxial region 50. A N+ region 68 is formed within collector-epitaxial region 50 in order to make electrical contact to terminal 48 by an appropriate metallization layer which is shown schematically by lead 70. Similarly, a conduction path is provided to terminal 46 by a metalization lead 72. The common base region of transistor 66 is connected with emitter region 64 by metalization lead 74 thereby forming a diode therebetween which is equivalent to that shown in FIG. 3 of voltage clamp circuit 34. The value at which voltage clamp 44 limits the value of the voltage applied thereacross can be varied from one clamp circuit to another by area ratioing the respective emitter regions 64 and 62 as indicated in FIG. 4, where N is equal to a positive number.

Because transistor 66 of voltage clamp circuit 44 may be realized in the same integrated circuit that differential amplifier 10 is formed and is fabricated of like structure as transistors 12 and 14 it will track the emitter-breakdown voltages of the two transistors. Therefore, if the emitter-base breakdown voltage of transistors 12 and 14 varies due to process and temperature variations, the value at which clamp circuit 44 is rendered conductive to clamp the voltage applied thereacross will vary in the direct manner as the reverse breakdown voltage of the two transistors so that clamp circuit 44 tracks the breakdown characteristics of the two transistors.

Turning to FIGS. 6 and 7 there is illustrated voltage clamp circuit 80 that operates as aforedescribed and which can be fabricated in a single isolated epitaxial region of an integrated circuit. Voltage clamp circuit 80 is illustrated schematically as comprising a single transistor 82 including a pair of emitters 84 and 86 coupled respectively to terminals 88 and 90 to which a voltage may be applied thereto. The base of transistor 82 is commonly formed between the two emitters and is open-circuited with the collector region formed with emitter 86 and connected to terminal 90. Voltage clamp 80 is realized in integrated circuit form as is illustrated by integrated circuit portion 92 wherein a substrate 94 has a epitaxial layer is formed thereon. P+ isolating wells 96 are formed within the epitaxial layer to produce an isolated epitaxial region 98. Again, a buried layer 100 may be formed between epitaxial region 98 and substrate 94. A common base region 102 is then formed within the isolated epitaxial region 98 into which the emitter region 104 is then formed such by diffusion techniques and which corresponds to emitter 84. Emitter region 86 is realized by region 106 then is formed within base region 102 and extends outwardly into isolated epitaxial region 98. The portion of emitter region 106 extending into epitaxial region 98 provides the common connection of emitter 86 with the collector region of transistor 82. Metallization leads 108 and 110 are realized to connect emitter region 84 and commonly connected emitter region 86 and collector region 98 of transistor 82 to terminals 88 and 90 respectively. As indicated, emitter regions 106 and 104 can be area ratioed with emitter region 106 being N times area of emitter region 104: N being a positive number.

Hence, what has been described above, is a novel voltage clamp circuit for clamping the voltage applied thereacross to a predetermined and adjustable value. In a preferred embodiment the voltage clamp circuit comprises a multiple emitter bipolar transistor that is fabricated in integrated circuit form having one of the emitters thereof return to the common base region of the transistor thereby forming a semiconductor impedance means in parallel with the emitter-base junction of the other emitter of the transistor. The transistor is operated in an inverted mode with its main emitter-collector path being adapted to receive the applied voltage. In another embodiment of the invention the emitter region is formed in a portion of the collector region in addition to the base region of the transistor in order to provide a common connected therewith while the other emitter and the common collector-emitter region are adapted to receive the applied voltage. In this embodiment the common base region is open circuited. By change the area ratios of the emitters comprising the voltage clamp, the voltage clamp level can be adjusted.

We claim:

1. A two terminal integrated circuit for clamping a voltage applied across the two terminals to a predetermined value, the voltage level of the applied voltage at the first terminal of the two terminals being more positive than the voltage level applied to the second terminal, comprising:
   a substrate of semiconductor material of a first conductivity type having a planar upper surface;
   an epitaxial layer of semiconductor material of a second conductivity type formed on said surface of said substrate;
   an isolation region of semiconductor material of said first conductivity type for isolating a region of said epitaxial layer from the remainder thereof;
   a buried layer of semiconductor material of said second conductivity type formed between said substrate and said isolated epitaxial region;
   a first region of semiconductor material of said first conductivity type formed in said isolated epitaxial region which forms a PN junction therewith;
   a second region of semiconductor material of said second conductivity type formed in said first region;
   a third region of semiconductor material of said second conductivity type which is formed in both said first region and said isolated epitaxial region to form a semiconductor diode junction therebetween; and
   means for connecting said second region to the first terminal and said third region to the second terminal such that the voltage applied across said first and second terminals is clamped to a predetermined value as the magnitude of the voltage exceeds the reverse breakdown level between said second and said isolated epitaxial region.

2. A circuit for clamping a voltage applied across first and second terminals thereof to a predetermined value, comprising:
   a transistor which is operated in a inverted mode by having its emitter region connected to the first terminal to which the most positive voltage level of the applied voltage is received and the collector region of said transistor being connected to the second terminal wherein the voltage is clamped to a predetermined value when the applied voltage exceeds the reverse voltage breakdown between said emitter and collector regions; and
   semiconductor impedance means for providing an impedance between the base region and said collector region of said transistor to cause the magnitude of said clamped voltage to have a value that is less than the reverse voltage breakdown between the emitter-collector regions of said transistor having its base region short circuited and the reverse voltage breakdown between the emitter-collector regions of said transistor having its base region open circuited, wherein said semiconductor impedance means includes a second emitter region formed in common with said base and said collector regions of said transistor and conductive means connecting said second emitter region to the second terminal whereby said second emitter region and said collector region are both connected to the second terminal.

* * * * *